(12) United States Patent  
Lee et al.

(10) Patent No.: US 9,117,383 B1
(45) Date of Patent: Aug. 25, 2015

(54) VIBRATING DISPLAY PANELS FOR DISGUISING SEAMS IN MULTI-PANEL DISPLAYS

(71) Applicant: Google Inc., Mountain View, CA (US)

(72) Inventors: Johnny Lee, Mountain View, CA (US); Eric Teller, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 150 days.

(21) Appl. No.: 13/732,611

(22) Filed: Jan. 2, 2013

Related U.S. Application Data (60) Provisional application No. 61/636,458, filed on Apr. 20, 2012.

(51) Int. Cl.
*G06F 3/048* (2013.01)
*G09G 3/00* (2006.01)
*G09G 5/00* (2006.01)

(52) U.S. Cl.
CPC .......................................... *G09G 5/00* (2013.01)

(58) Field of Classification Search
CPC .............. G09G 3/3688; G09G 3/3648; G09G 2330/021; G09G 2300/026; G09G 2300/0236; G06F 3/1446; G06F 3/1431; G06F 2203/013–2203/015; G02F 1/13336; H04N 9/12
USPC .................................. 345/1.1, 1.3, 31, 40, 204
See application file for complete search history.

(56) References Cited

U.S. PATENT DOCUMENTS

| | | | |
|---|---|---|---|
| 7,145,611 B2 | 12/2006 | Dubin et al. | |
| 7,688,506 B2 | 3/2010 | Sugawara et al. | |
| 2002/0167459 A1* | 11/2002 | Baudisch et al. | 345/1.3 |
| 2004/0001166 A1 | 1/2004 | Nimura et al. | |
| 2004/0208394 A1* | 10/2004 | Kurata | 382/275 |
| 2005/0052376 A1* | 3/2005 | Shivji | 345/82 |
| 2006/0114172 A1* | 6/2006 | Shivji | 345/1.1 |
| 2006/0279702 A1 | 12/2006 | Kettle et al. | |
| 2007/0097323 A1 | 5/2007 | Otis et al. | |
| 2008/0143969 A1 | 6/2008 | Aufranc et al. | |
| 2009/0079681 A1* | 3/2009 | Chang et al. | 345/88 |

* cited by examiner

*Primary Examiner* — Kent Chang
*Assistant Examiner* — Mark Edwards
(74) *Attorney, Agent, or Firm* — Blakely Sokoloff Taylor & Zafman LLP

(57) ABSTRACT

A multi-panel display includes at least one anchoring platform, a plurality of display panels, vibration mechanisms, and control logic. The anchoring platform(s) are to be secured to a fixed surface. The plurality of display panels is aligned to form the multi-panel display and the display panels are substantially rectangular. The vibration mechanisms are configured to vibrate the plurality of display panels along a vibration axis. The vibration mechanisms are coupled to the anchoring platform(s), and the vibration axis is common to each of the display panels in the plurality of display panels. The control logic is coupled to drive the vibration mechanisms and configured to drive the plurality of display panels to display images corresponding with positions along the vibration axis to disguise seams between the plurality of display panels.

20 Claims, 9 Drawing Sheets

VIBRATING DISPLAY PANELS FOR DISGUISING SEAMS IN MULTI-PANEL DISPLAYS

CROSS REFERENCE TO RELATED APPLICATIONS

This application claims priority under the provisions of 35 U.S.C. §119(e) to U.S. Provisional Application No. 61/636,458 filed on Apr. 20, 2012.

TECHNICAL FIELD

This disclosure relates generally to optics, and in particular but not exclusively, relates to display panels.

BACKGROUND INFORMATION

Large displays can be prohibitively expensive as the cost to manufacture display panels rises exponentially with display area. This exponential rise in cost arises from the increased complexity of large monolithic displays, the decrease in yields associated with large displays (a greater number of components must be defect free for large displays), and increased shipping, delivery, and setup costs. Tiling smaller display panels to form larger multi-panel displays can help reduce many of the costs associated with large monolithic displays.

Figure 1A:
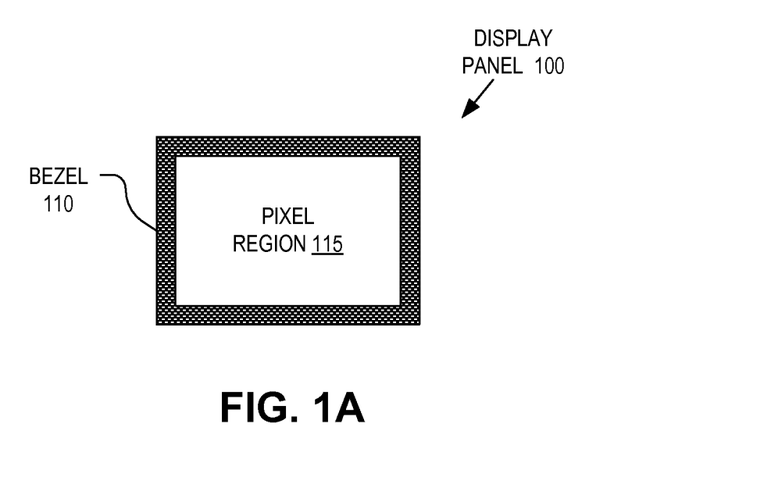
FIGS. 1A and 1B illustrate conventional display panel tiling.
Figure 1B:
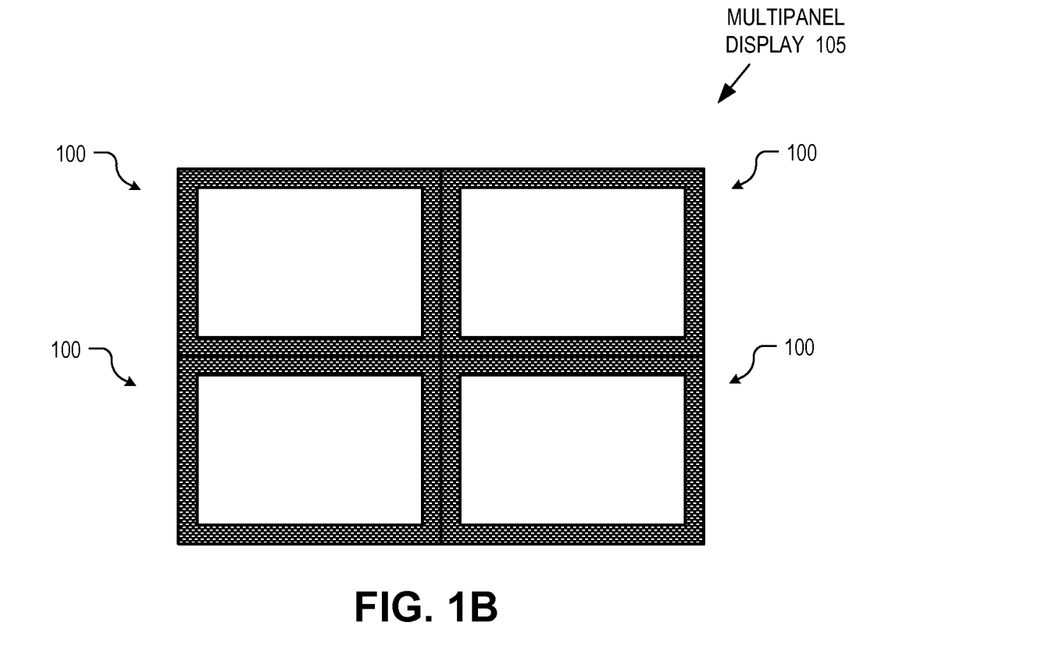

FIGS. 1A and 1B illustrate how tiling multiple smaller, less expensive display panels 100 together can achieve a large multi-panel display 105, which may be used as a large wall display. The individual images displayed by each display panel 100 may constitute a sub-portion of the larger overall-image collectively displayed by multi-panel display 105. While multi-panel display 105 can reduce costs, visually it has a major drawback. Each display panel 100 includes a bezel 110 around its periphery. Bezel 110 is a mechanical structure that houses pixel region 115 in which the display pixels are disposed. In recent years, manufactures have reduced the thickness of bezel 110 considerably to less than 2 mm. However, even these thin bezel trims are still very noticeable to the naked eye, distract the viewer, and otherwise detract from the overall visual experience.

Various other approaches for obtaining seamless displays include display lensing, blended projection, stackable display cubes, and LED tiles. Display lensing places a single contiguous lens in front of each display panel 100 to present a fused borderless image in a particular "sweet spot." However, the viewing angle is relative narrow and image distortion along continuous lines still occurs. Blended projection uses software stitching and mechanical mounting of traditional projection screens. Currently, blended projection uses relatively low cost hardware and is a good option for non-planar surfaces. However, there are significant physical constraints on usage and installation and requires regular maintenance and sophisticated calibration.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method for disguising seams in multi-paneled display are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 2A:
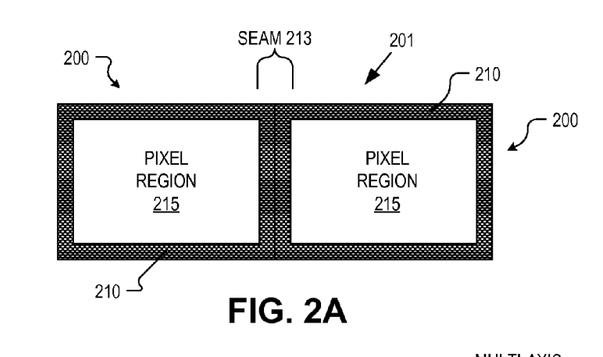
FIGS. 2A-2D illustrate different vibration axes that may be used to disguise bezel seams between display panels in multi-panel displays, in accordance with an embodiment of the disclosure.

FIGS. 2A-2D illustrate different vibration axes that may be used to disguise bezel seams between display panels in multi-panel displays, in accordance with an embodiment of the disclosure. FIG. 2A includes a multi-panel display 201 having two display panels 200 that are tiled side-by-side. Display panel 200 may be substantially rectangular. Each display panel 200 has a bezel 210 surrounding a pixel region 215. Seam 213 is the portion of the bezels 210 that are between the pixel regions 215 of the display panels 200. Pixel region 215 could be implemented a display panel of light-emitting-diodes ("LEDs"), an organic LED ("OLED") panel, a liquid crystal display ("LCD"), a quantum dot array, a liquid crystal on silicon ("LCoS") panel, or otherwise.

Figure 2B:
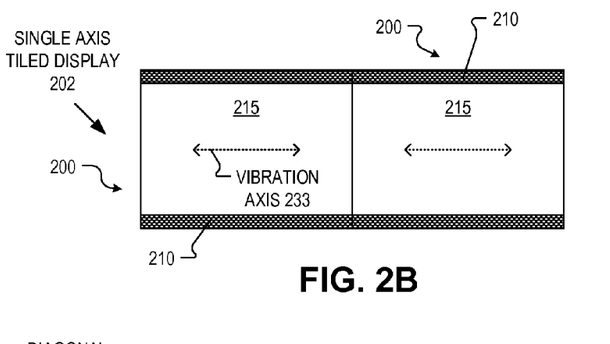

FIG. 2B illustrates a single axis tiled display 202. In single axis tiled display 202, the two display panels 200 can be vibrated or shifted back and forth along vibration axis 233. By vibrating back and forth, pixel regions 215 can be positioned where the bezels 210 in seam 213 were previously positioned. The image light displayed from pixel region 215 (while pixel region 215 is positioned where the bezels 210 were previously positioned) can disguise or even conceal seam 213 as a viewer perceives the image light from pixel region 215, rather than perceiving bezel seam 213. To disguise bezel seam 213, the lateral translation of the two display panels 210 may be the width of seam 213, which may be twice the thickness of the bezels of the display panels. The vibration frequency of the display panels 200 along vibration axis 233 must be fast enough so that a viewer cannot easily see the portion of bezels 210 in seam 213. The vibration frequency may have to meet a minimum frequency to prevent a viewer from perceiving bezel 210. In one embodiment, the vibration frequency is 120 Hz.

Figure 2C:
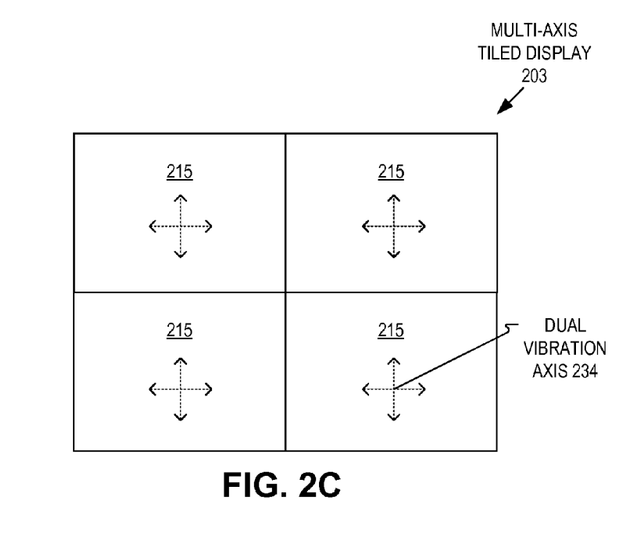

FIG. 2C illustrates a multi-axis tiled display 203. In multi-axis tiled display 203, four display panels 200 can be vibrated or shifted back and forth along dual vibration axis 234, having two vibration axes. In the illustrated embodiment, the two vibration axes are each substantially parallel to edges or sides of display panels 200. Display panels may be moved along both axes 234 at the same time. In other words, a display panel 200 may be moved up on one axis and to the left on another axis, as an example.

Figure 2D:
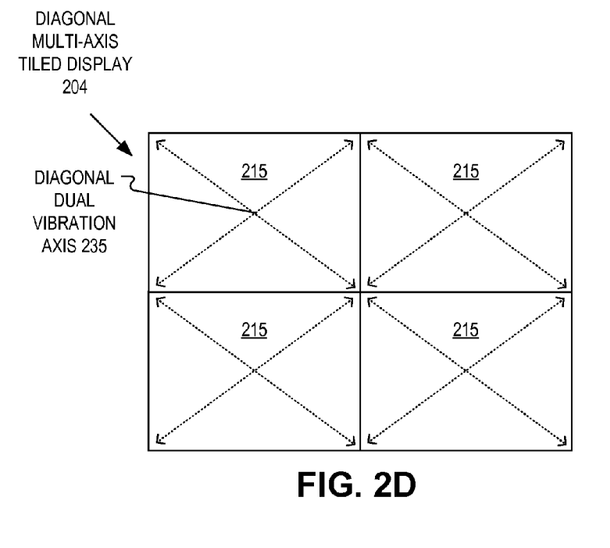

FIG. 2D illustrates diagonal dual vibration axis 235. In diagonal multi-axis tiled display 204, four display panels 200 can be vibrated or shifted back and forth along diagonal dual vibration axis 235, having two vibration axes. In the illustrated embodiment, the two vibration axes span diagonally across each display panel 200. A first vibration axis may spans diagonally from a first corner of each of the display panels to a second corner of each of the display panels. A second vibration axis spans diagonally from a third corner of each of the display panels to a fourth corner of each of the display panels. Although FIGS. 2C and 2D show each display panel 200 having its own vibration axes (e.g. axis 234 and 235), in one embodiment, each of the display panels 200 are fixed (i.e. locked) together and are moved/vibrated together as one unit. It is appreciated that FIG. 2B-2D are simply examples and that more display panels 200 than are illustrated could be added to the multi-panel displays to create a larger overall display area.

In order to display clear images while multi-panel displays 202, 203, 204 are shifting/vibrating, it may be necessary to coordinate the display of the image with a position on a given vibration axis. The images may be counter-shifted (horizontally and/or vertically) to different portions of pixel regions 215 so each image pixel of the image is maintained in terms of absolute space. In one example, when the display panel 200 (including pixel region 215) is shifted to the right 1 mm, the image displayed by the display panel is shifted to the left 1 mm to compensate and preserve the spatial positions of the image pixels. It is understood that if the display panel is shifted to the right 1 mm and the displayed image is counter-shifted to the left 1 mm, pixels near the right border of pixel region 215 may display new (border) image pixels to complete the outer boundaries of the displayed image for that point in space. Since the bezel widths may be relatively small (e.g. less than 5 mm), majority portions of the images may be displayed (although counter-shifted to different pixels) throughout one vibration cycle, even if the boundaries of the images change. Without coordinating the displayed image with the shifting/vibration of the display panels, a viewer may see an unacceptably blurred image.

Figure 3A:
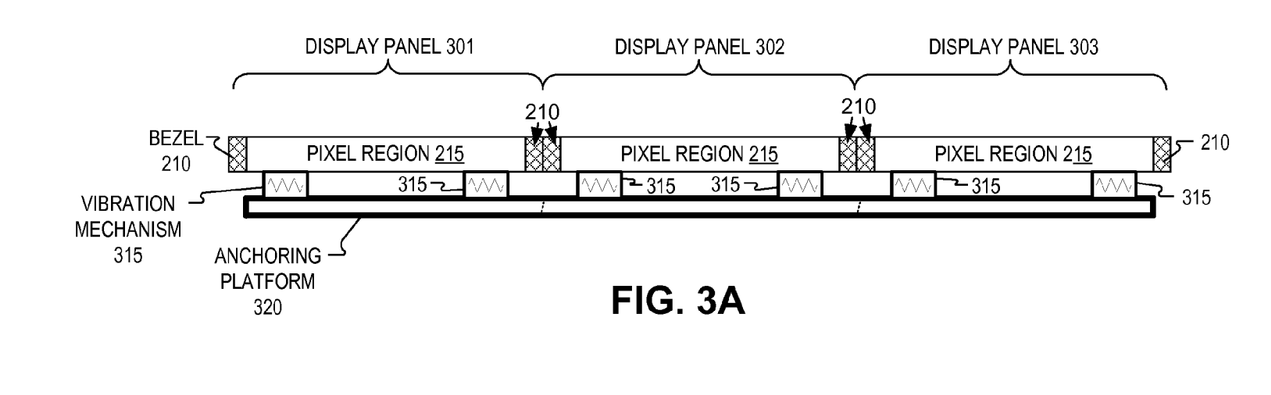
FIGS. 3A and 3B illustrate example multi-panel displays with display panels coupled to vibration mechanisms driven by control logic that also drives the display panels to display images corresponding with positions of the vibration mechanisms, in accordance with an embodiment of the disclosure.
Figure 3B:
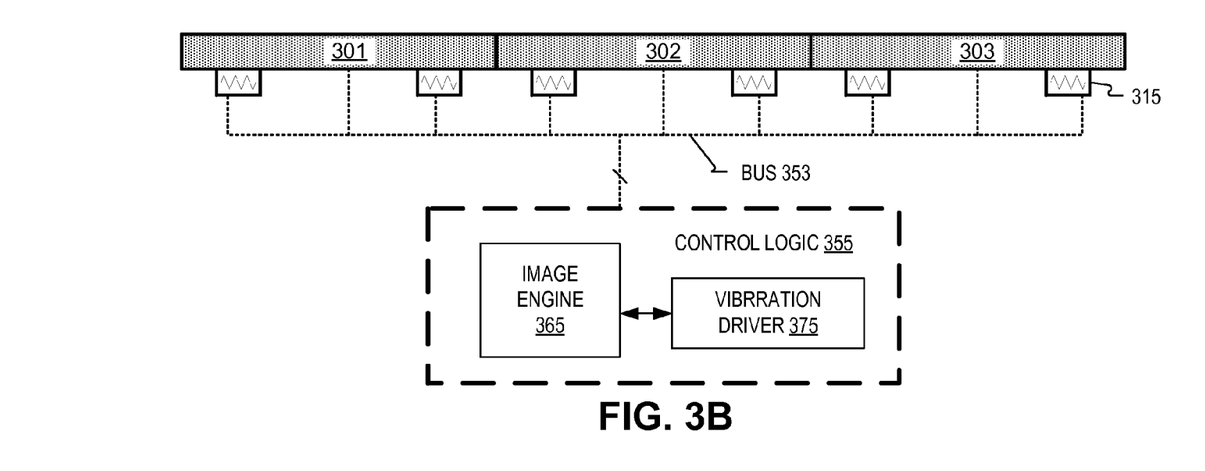

FIGS. 3A and 3B illustrate example multi-panel displays with display panels coupled to vibration mechanisms driven by control logic that also drives the display panels to display images corresponding with positions of the vibration mechanisms, in accordance with an embodiment of the disclosure. FIG. 3A shows a cross-sectional top view of display panels 301, 302, and 303 arranged side-by-side. Display panels 301, 302, and 303 have a pixel region 215 surrounded by bezel 210. Displays 301, 302, and 303 may be substantially rectangular.

FIG. 3A includes an anchoring platform 320 that may be configured to be secured to a fixed surface. Anchoring platform 320 may be a metal plate with holes for screws or bolts to secure it to a wall of a room. Anchoring platform 320 may include more than one piece. For example, anchoring platform 320 may be broken up into multiple plates. In the illustrated embodiment, vibration mechanisms 315 are coupled to anchoring platform 320 and configured to vibrate display panels 301, 302, and 303 along at least one vibration axis. Vibration mechanisms 315 may include piezoelectric crystal actuators, micro-electro-mechanical-system ("MEMS") actuators, magnetic actuators, voice coil actuators, or otherwise.

FIG. 3B includes display panels 301, 302, and 303 and the vibration mechanisms 315 coupled to the display panels. In the illustrated embodiment, control logic 355 is coupled to drive the vibration mechanisms and configured to drive the display panels to display images corresponding with positioned along the vibration axis to disguise seams between the display panels. Vibration mechanisms 315 may be coupled to shift the display panels along more than one vibration axis, as illustrated in FIGS. 2C and 2D. Control logic 355 may be coupled to the display panels and the vibration mechanisms via bus 353. Control logic 355 may include an image engine 365 to generate images or video to drive the display panels to display images corresponding with positions along the vibration axis. Vibration driver 375 may be configured to drive vibration mechanisms 315 to vibrate along a vibration axis. Vibration driver 375 and image engine 365 may be communicatively coupled to coordinate the images displayed by the display panels with the vibration position of the display panels. Control logic 355 may include a processor, a Field Programmable Gate Array ("FPGA"), and other logic for driving images to the display panels. Control logic 355 may include memory for storing images and/or instructions.

Figure 4A:
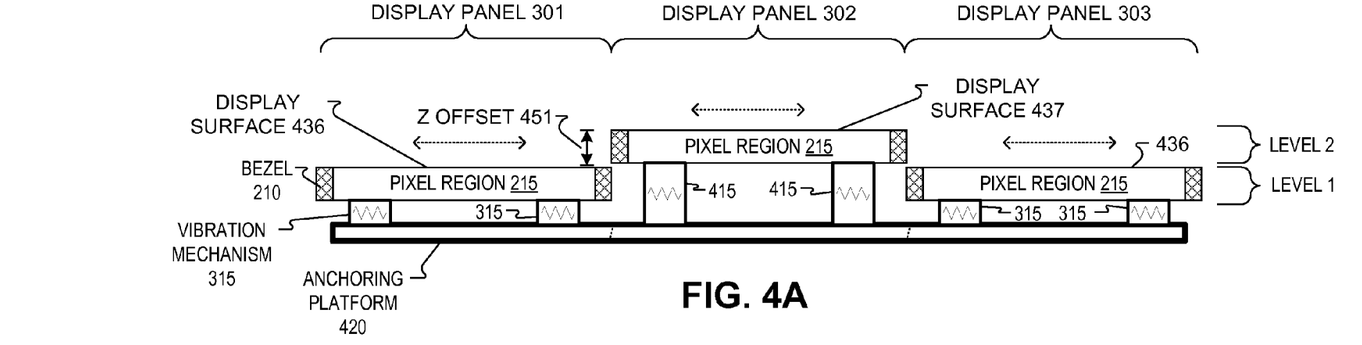
FIGS. 4A and 4B illustrate example multi-panel displays that include offset display panels coupled to vibration mechanisms, in accordance with an embodiment of the disclosure.
Figure 4B:
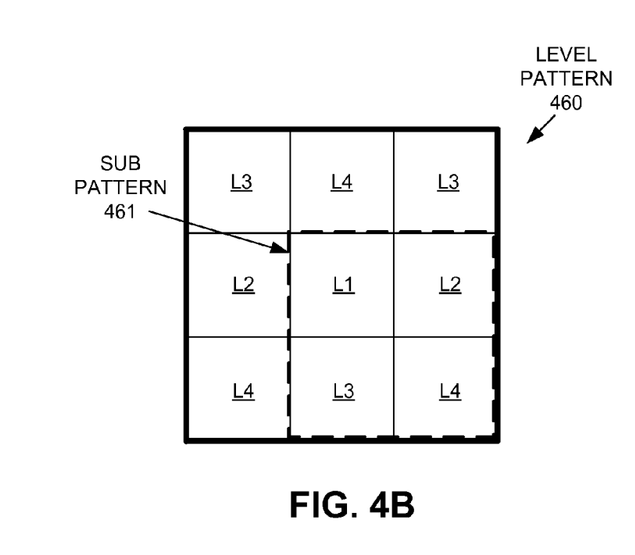

FIGS. 4A and 4B illustrate example multi-panel displays that include offset display panels coupled to vibration mechanisms, in accordance with an embodiment of the disclosure. FIG. 4A shows a cross-sectional top view of display panels 301, 302, and 303 aligned to form a multi-panel display. A display surface 436 of display panel 301 and display panel 303 is offset behind display surface 437 of display panel 302 by Z offset 451. In the illustrated embodiment, display surfaces 436 of display panels 301 and 303 are offset from display surface 437 of display panel 302 by at least a depth of display panel 302. An offset of at least the depth of the display panel allows display panel 302 to move side to side or back and forth along a vibration axis without interfering with the shifting or vibration of display panels 301 and 303. The offset display panel embodiment of FIG. 4A may have a potential advantage over the side-by-side embodiment of FIG. 3A in that it may not be necessary to synchronize or coordinate the vibration of each display panel with the other display panels to avoid mechanical interference—the display panels may shift/vibrate asynchronously from each other. This may reduce the size of vibration mechanisms 315 because it may take a more powerful vibration mechanism 315 to effect a coordinated vibration/shifting of every display panel in a multi-panel display, at the same time. In FIG. 4A, display panel 302 may be shifted along two vibration axes without regard for the position that display panels 301 and 303 are being driven to along the vibration axis or axes.

Vibration mechanisms 415 are illustrated as taller than vibration mechanisms 315 to show the offset of display panel 302. Of course, vibration mechanisms 415 may be the same as vibration mechanisms 315 if Z offset 451 is accomplished by physically offsetting vibration mechanisms 315 from anchoring platform 420 or display panel 302, or otherwise.

FIG. 4B illustrates an example offset or level pattern for a multi-panel display with nine display panels. FIG. 4A shows that display panels 301 and 303 are on level 1 and display panel 302 is on level 2 in order to avoid interfering with each other's vibration shifts. When a multi-panel display has displays tiled in both rows and columns (in other words, at least a 2×2 array of display panels), the multi-panel display may need to have vibration mechanisms 315 vibrate along multiple vibration axes to disguise or conceal the seams between the display panels. Level pattern 460 shows an example level pattern for a nine panel multi-panel display that prevents display panels from interfering with one another when the display panels are vibrated (asynchronously) along multiple vibration axes. Sub-pattern 461 shows that in any given 2×2 display panel matrix in level pattern 460, each display panel is offset at a different level (Level 1 "L1," Level 2 "L2," Level 3 "L3," and Level 4 "L4"). Each display panel in a 2×2 matrix may be required to be at a different offset level to avoid mechanical interference, especially at the intersection of the four display panels in a given 2×2 matrix.

Figure 5A:
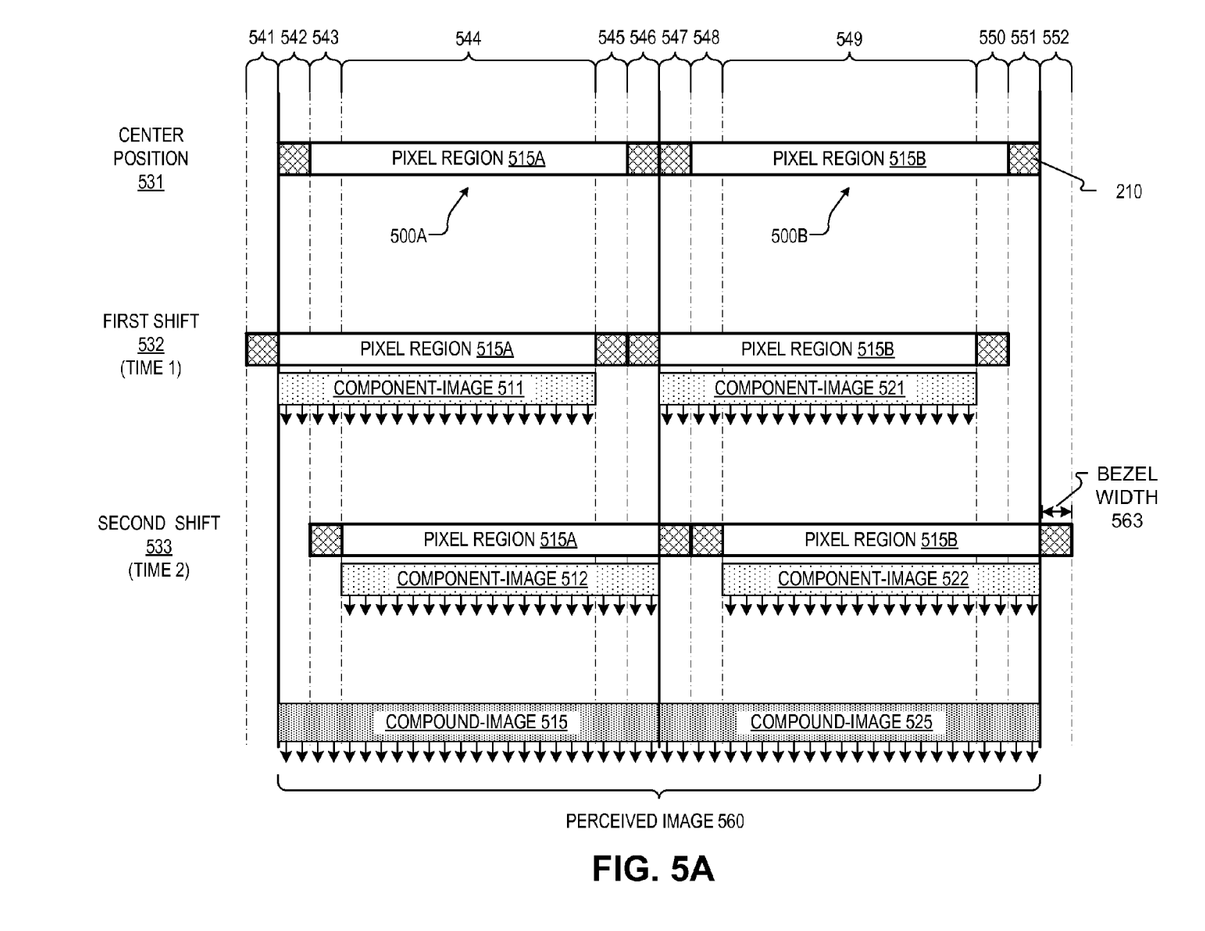
FIGS. 5A-5C illustrate two displays being shifted on a vibration axis and displaying images associated with positions on the vibration axis to form a perceived image that disguises bezel seams of the two displays, in accordance with an embodiment of the disclosure.
Figure 5B:
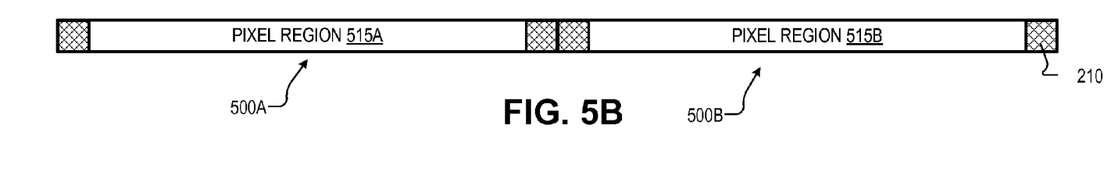
Figure 5C:
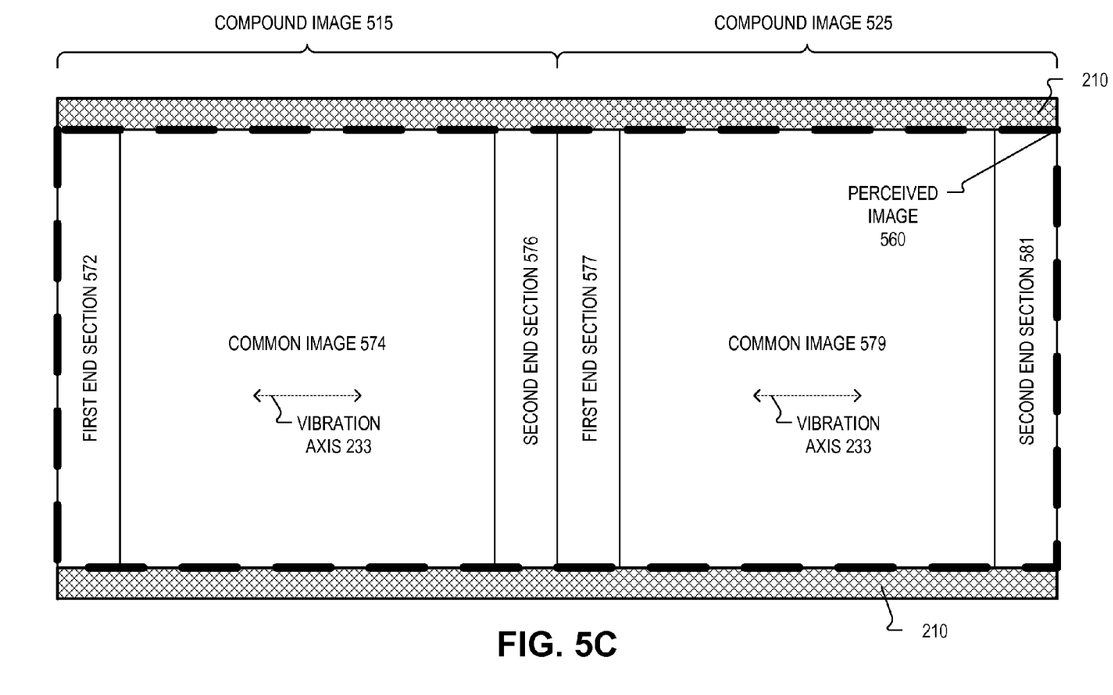

FIGS. 5A-5C illustrate two displays being shifted on a vibration axis and displaying images associated with positions on the vibration axis to form a perceived image that disguises bezel seams of the two display, in accordance with an embodiment of the disclosure. FIG. 5A shows a cross-sectional top view of two display panels 500, each including pixel region 515 surrounded by bezel 210. When the display panels are at center position 531, pixel regions 515 emit image light in viewing regions 543-545, and 548-550. Center position 531 may be the position the display panels 500 are in when vibration mechanisms 315 or 415 are not actuated or not being driven, although display panels 500 may be in a different position (other than center position 531) when the vibration mechanisms 315 or 415 are not being driven (turned off).

Display panels 500A and 500B may both be shifted to the left to a first shift position 532 at a first time. When display panel 500A is at its first shift position 532, pixel region 515A may display a component image 511. Component image 511 displays image light in viewing region 542 (as well as 543 and 544), where bezel 210 was previously positioned. When display panel 500B is at its first shift position 532, pixel region 515B may display a component image 521. Component image 521 displays image light in viewing region 547, where bezel 210 was previously positioned. Display panels 500 may both be shifted to the right to a second shift position 533 at a second time. When display panel 500A is at its second shift position 533, pixel region 515A may display a component image 512. Component image 512 displays image light in viewing region 546, where bezel 210 was previously positioned. When display panel 500B is at its second shift position 533, pixel region 515B may display a component image 522. Component image 522 displays image light in viewing region 551, where bezel 210 was previously positioned. To disguise interior bezels of display panels 500A and 500B, the lateral translation from first shift position 532 to second shift position 533 may be twice bezel width 563.

Image light from component image 511 (viewing regions 542-544) and component image 512 (viewing region 544-546) may form compound image 515 (viewing region 542-546). Image light from component image 521 (viewing regions 547-549) and component image 522 (viewing regions 549-551) may form compound image 525. Compound images 515 and 525 form perceived image 560. Perceived image 560 spans from viewing region 542-551. Perceived image 560 may be an integral image that includes image light from component images 511, 512, 521, and 522. Because pixel regions 515A and 515B emit image light in viewing regions 542-551, a viewer may not perceive a seam created by bezels 210, if the display panels 500A and 500B are vibrated at a fast enough frequency. In one embodiment, the vibration frequency is 120 Hz. It is appreciated that each display panel in a multi-panel may have different vibration frequencies and the vibration frequencies may not be synchronized, in the embodiments illustrated in FIGS. 4A and 4B where the display panels are offset in the z dimension to prevent physical interference.

FIG. 5B is a top view of display panels 500A and 500B and FIG. 5C is a corresponding front view of display panels 500A and 500B, as a viewer would see. Referring back to FIG. 5A, pixel regions 515A and 515B display image light in viewing regions 542, 543, 545-548, 550, and 551 at either first shift position 532 and second shift position 533. In contrast, pixel regions 515A and 515B display image light in viewing regions 544 and viewing regions 549 in both first shift position 532 and second shift position 533, which may contribute to viewing regions 544 and 549 having brighter image light in perceived image 560.

Pixel brightness of pixels in pixel regions 515A and 515B may be adjusted to compensate for uneven brightness in sections of compound images 515 and 525. If viewing regions 544 and 549 have brighter image light, common image sections 574 and 579 of compound images 515 and 525 have brighter image light. Optionally, the light output of compound images 515 and 525 may be normalized so that image light brightness in the compound images is more even. If display panels 500A and 500B are organic light-emitting-diode ("OLED") displays, OLED pixels in the display may be selectably driven to create the desired image brightness across compound images 515 and 525.

To generate compound image 515, component image 511 includes first end section 572 (corresponding to viewing regions 542-543) and common image section 574 (corresponding to viewing region 544). OLED pixels in pixel region 515A that generate first end section 572 of component image 511 may be driven to be brighter than the pixels that generate common image section 574 of component image 511, in order to even image brightness in compound image 515. Similarly, component image 512 includes second end section 576 (corresponding to viewing regions 545-546) and common image section 574. And, OLED pixels in pixel region 515A that generate second end section 576 of component image 512 may be driven to be brighter than the OLED pixels that generate common image section 574 of component image 512, in order to even image brightness in compound image 515.

To generate compound image 525, component image 521 includes first end section 577 (corresponding to viewing regions 547-548) and common image section 579 (corresponding to viewing region 549). OLED pixels in pixel region 515B that generate first end section 577 may be driven to be brighter than pixels that generate common image section 579 of component image 521, in order to even image brightness in compound image 525. Similarly, component image 522 includes second end section 587 (corresponding to viewing regions 550-551) and common image section 579. And, OLED pixels in pixel region 515B that generate second end section 5781 of component image 521 may be driven to be brighter than the OLED pixels that generate common image section 574 of component image 522, in order to even image brightness in compound image 525.

As an alternative to brightening OLED pixels while they are generating image light for first and second end sections, the OLED pixels generating image light for common image sections 574 and 579 may be driven to emit less light to even out image brightness in compound images 515 and 525. Of course, these techniques for evening image light in compound images that are described in connection with FIGS. 5A-5C could be applied to a multi-panel display with more than one vibration axis.

The embodiment shown in FIG. 5A is only one example of creating a perceived image 560 that disguises or conceals bezel seams. In one embodiment, instead of displaying only two images (e.g. component image 511 and component image 512) to generate a compound image (e.g. compound image 515), more than two images are displayed to generate a compound image. In one example, four images are generated corresponding with four positions along a vibration axis (e.g. vibration axis 233) to generate a compound image or images. The display panel may need to be capable of an increased refresh rate when more images are displayed corresponding with positions along a vibration axis. It is appreciated that any number of images could be generated corresponding with different positions of the display panel. It is also appreciated that images could be generated with corresponding images along vibration axes that would be perceived as motion-picture media.

In one embodiment, instead of displaying a specific image in end sections 572, 576, 577, and 581, a randomized pixel pattern is displayed in the end sections. Pixel randomization operates to reduce regular patterns (e.g. the straight edge of bezel 210) which the eye tends to easily identify, with irregular patterns. Especially with smaller bezels, light from a randomized pixel pattern may be effective in disguising a bezel seam from a viewer when compared with viewing a stationary bezel.

Figures 6A, 6C:
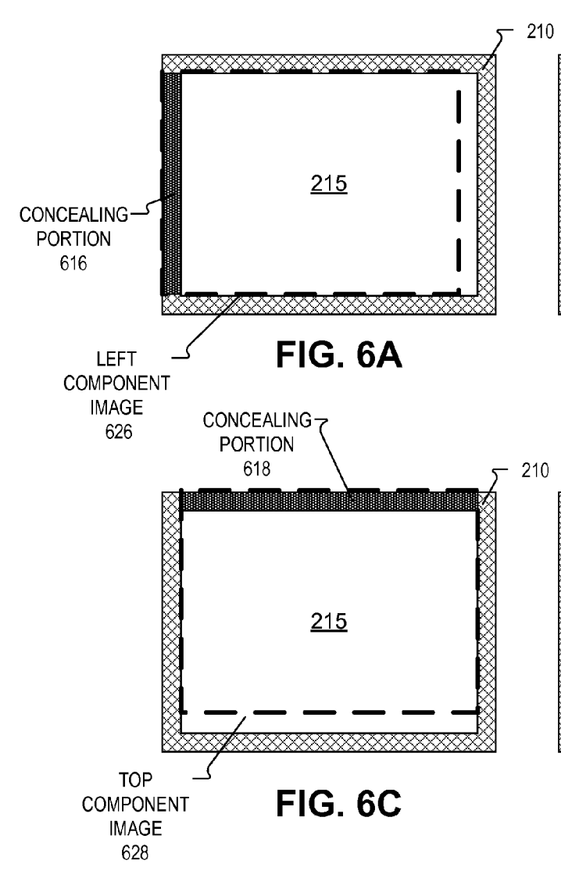
FIGS. 6A-6D illustrate an example display panel being shifted to disguise portions of different sides of a bezel, in accordance with an embodiment of the disclosure.
Figures 6B, 6D:
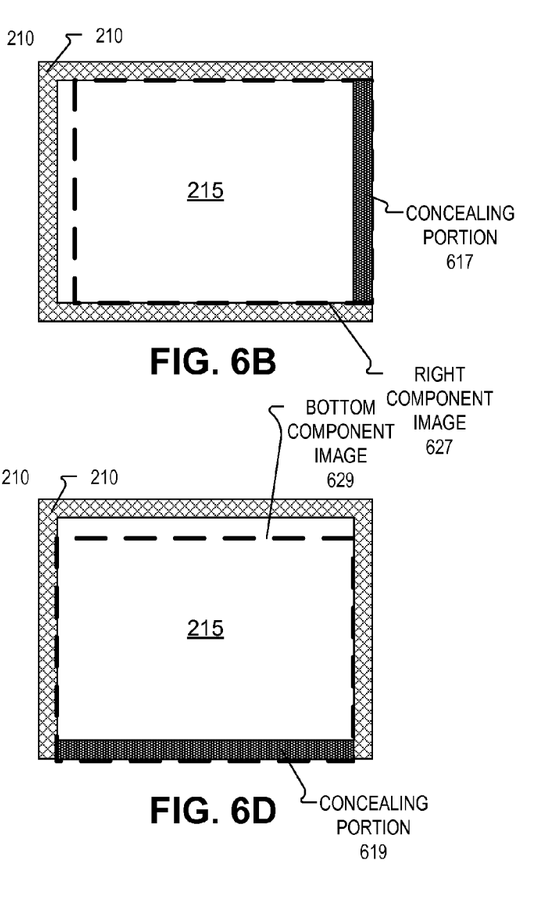

FIGS. 6A-6D illustrate an example display panel being shifted to disguise portions of different sides of a bezel, in accordance with an embodiment of the disclosure. FIGS. 6A-6B show how an example display panel could be shifted to disguise or conceal display panel bezels from side to side. In FIG. 6A, pixel region 215 is shifted to the left (with the rest of display panel 200) to display left component image 626. Pixels in concealing portion 616 of pixel region 215 display image light to disguise or conceal where bezel 210 was previously positioned. In FIG. 6B, pixel region 215 is shifted to the right to display right component image 627. Pixels in concealing portion 617 of pixel region 215 display image light to disguise or conceal where bezel 210 was previously positioned. Left component image 626 and right component image 627 may combine to form a compound image that is part of an overall perceived image(s).

FIGS. 6C-6D show how an example display panel would be shifted to disguise or conceal display panel bezels from top to bottom. In FIG. 6C, pixel region 215 is shifted up to display top component image 628. Pixels in concealing portion 618 of pixel region 215 display image light to disguise or conceal where bezel 210 was previously positioned. In FIG. 6D, pixel region 215 is shifted down to display bottom component image 629. Pixels in concealing portion 619 of pixel region 215 display image light to disguise or conceal where bezel 210 was previously positioned. Top component image 628 and bottom component image 629 may combine to form a compound image that is part of an overall perceived image(s).

When a multi-panel display includes at least a 2×2 matrix of display panels that are tiled together, the techniques of FIGS. 6A-6D (even in combination) may not adequately disguise or conceal the corners of the bezels of the display panels where the display panels intersect in the middle of the 2×2 matrix. This is because pixel region 215 in FIGS. 6A-6D does not shift to cover the far corners of the bezel 210. Therefore, it may be advantageous to shift pixel region 215 to display image light where the corner of the bezel was previously positioned. Referring back to FIG. 2C, shifting pixel region 215 to the corners of the bezel could be achieved by shifting pixel region 215 on both of the axes in dual vibration axis 234. This may require driving vibration mechanism 315/415 to shift the display panel on a first axis and also driving vibration mechanism 315/415 to shift the display panel on a second axis, in order to reach the corner of the bezel. Alternatively, vibration mechanism 315/415 may be configured as shown in FIG. 2D, where the two axes in diagonal dual vibration axis 235 run diagonally between the corners of the display panels. This may be advantageous in comparison to FIG. 2C because vibration mechanism 315/415 may only need to be driven to shift a display panel on one axis so that pixel region 215 can reach the locations shown in FIG. 7A-7D.

Figures 7A, 7C:
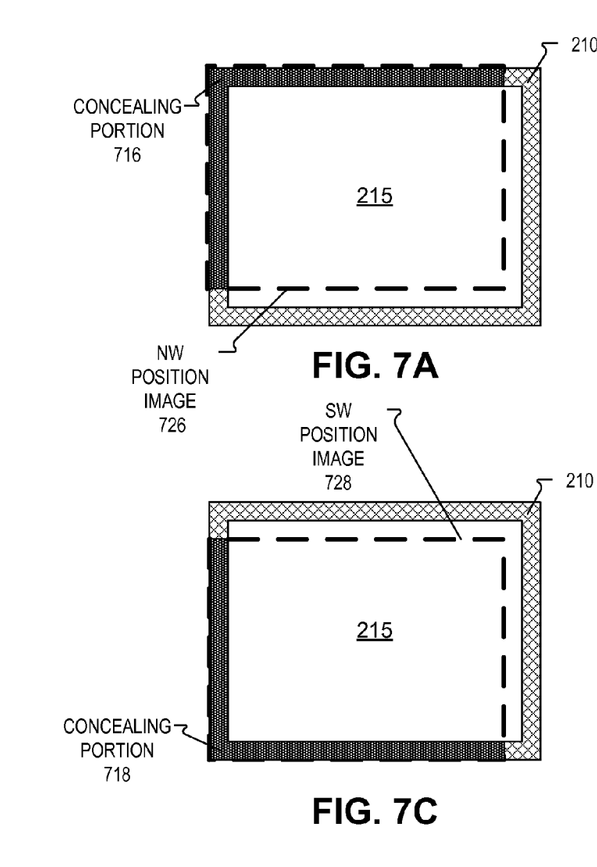
FIGS. 7A-7D illustrate an example display panel being shifted to four different positions on two axes to display images that disguise portions of a bezel, in accordance with an embodiment of the disclosure.
Figures 7B, 7D:
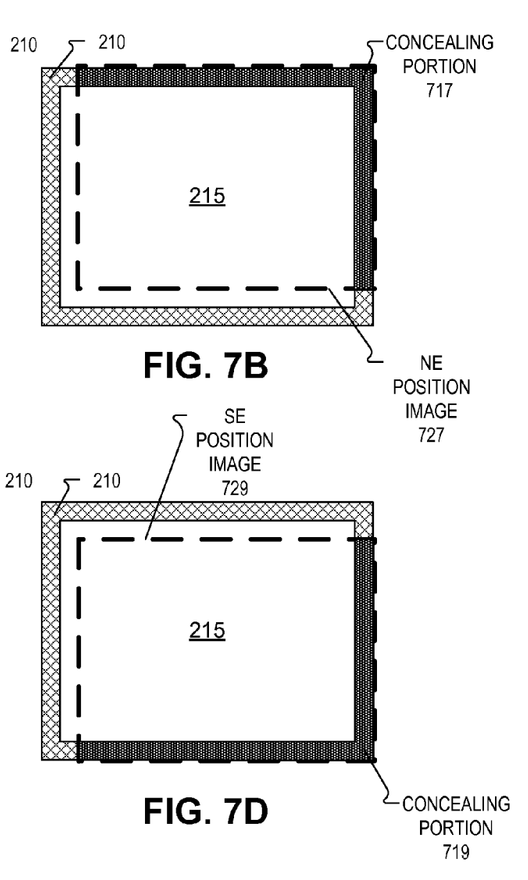

FIGS. 7A-7D illustrate an example display panel being shifted to four different positions on two axes to display images that disguise portions of a bezel, in accordance with an embodiment of the disclosure. In FIG. 7A, pixel region 215 is shifted up and to the left (with the rest of display panel 200) to display Northwest ("NW") position image 726. Pixels in concealing portion 716 of pixel region 215 display image light to disguise or conceal where portions of the top side and left side of bezel 210 were previously positioned. In FIG. 7B, pixel region 215 is shifted up and to the right to display Northeast ("NE") position image 727. Pixels in concealing portion 717 of pixel region 215 display image light to disguise or conceal where portions of the top side and right side of bezel 210 were previously positioned. In FIG. 7C, pixel region 215 is shifted down and to the left to display Southwest ("SW") position image 728. Pixels in concealing portion 718 of pixel region 215 display image light to disguise or conceal where portions of the bottom side and left side of bezel 210 were previously positioned. In FIG. 7D, pixel region 215 is shifted down and to the right to display Southeast ("SE") position image 729. Pixels in concealing portion 719 of pixel region 215 display image light to disguise or conceal where portions of the bottom side and right side of bezel 210 were previously positioned. NW position image 726, NE position image 727, SW position image 728, and SE position image 729 may be component images that combine to form a compound image that is part of an overall perceived image(s).

Figure 8:
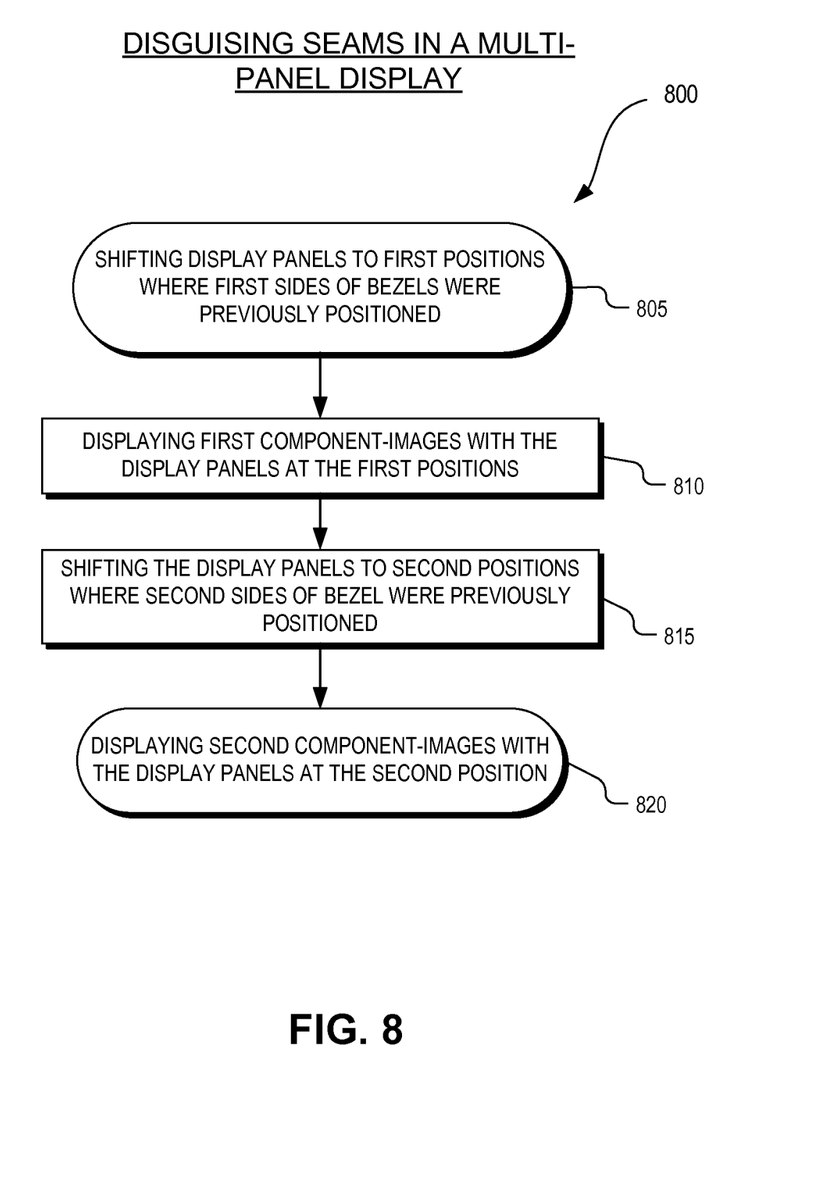
FIG. 8 illustrates a flow chart illustrating an example process 800 of disguising seams in multi-panel displays, in accordance with an embodiment of the disclosure.

FIG. 8 illustrates a flow chart illustrating an example process 800 of disguising seams in multi-panel displays, in accordance with an embodiment of the disclosure. The order in which some or all of the process blocks appear in process 800 should not be deemed limiting. Rather, one of ordinary skill in the art having the benefit of the present disclosure will understand that some of the process blocks may be executed in a variety of orders not illustrated, or even in parallel.

In process block 805, display panels are shifted in first directions (e.g. to the left along a vibration axis) to first positions (e.g. first shift position 532), where first sides of bezels (e.g. FIG. 6A's left side of bezel 210 or FIG. 7A's left and top sides of bezel 210) were previously positioned. Pixel regions of the display panels (e.g. pixel regions 515A and 515B) may then display first component-images (e.g. component-images 511 and 521), in process block 810. In process block 815, the display panels are shifted in second directions (e.g. right along a vibration axis) to second positions (e.g. second shift position 533), where second sides of bezels (e.g. FIG. 6B's right side of bezel 210 or FIG. 7B's right and bottom side of bezel 210) were previously positioned. Pixel regions of the display panels may then display second component-images (e.g. component images 512 and 522), in process block 820. It is appreciated that all the display panels in a multi-panel display may not be shifted to their first position at the same time (synchronously) as the other display panels. In some embodiments, each display panel is shifted to its first position (via vibration mechanism 315, for example) independently, or asynchronously, even if a vibration frequency of all the vibration mechanisms in the multi-panel display are vibrated at the same numerical frequency.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A multi-panel display comprising:
   at least one anchoring platform to be secured to a fixed surface;
   a plurality of display panels aligned to form the multi-panel display, wherein the display panels are substantially rectangular, and wherein each display panel in the plurality of display panels is an organic light emitting diode ("OLED") display panel;
   vibration mechanisms configured to vibrate the plurality of display panels along a vibration axis, wherein the vibration mechanisms are coupled to the at least one anchoring platform, and wherein the vibration axis is common to each of the display panels in the plurality of display panels; and
   control logic coupled to drive the vibration mechanisms and configured to drive the plurality of display panels to display images corresponding with positions along the vibration axis to disguise seams between the plurality of display panel, wherein the control logic is also coupled to drive border OLED pixels in the display panels to emit a first quantity of image light when the display panels are vibrated to a first seam position along the vibration axis, and wherein the control logic is further coupled to drive non-border OLED pixels in the OLED display panels to emit a second quantity of the image light which is less than the first quantity, the border OLED pixels having a width of a bezel width of the OLED display panels.

2. The multi-panel display of claim 1, wherein the plurality of display panels includes a first display panel with a first display surface and a second display panel with a second display surface, wherein the second display surface is offset behind the first display surface by at least a depth of the first display panel.

3. The multi-panel display of claim 2, wherein the plurality of display panels includes a third display panel with a third display surface and a fourth display panel with a fourth display surface, wherein the fourth display surface is offset behind the third display surface by at least a second depth of the third display panel, and wherein the first, second, third, and fourth display surfaces are offset from another in different display planes.

4. The multi-panel display of claim 1, wherein the vibration mechanisms are also configured to vibrate the plurality of display panels along a second vibration axis that is common to each of the display panels in the plurality of display panels.

5. The multi-panel display of claim 4, wherein the vibration axis spans diagonally from a first corner of each of the display panels to a second corner of each of the display panels, and where the second vibration axis spans diagonally from a third corner of each of the display panels to a fourth corner of each of the display panels, the first, second, third, and fourth corners being different from one another.

6. The multi-panel display of claim 4, wherein the second vibration axis is perpendicular to the vibration axis and parallel to two edges of each of the plurality of display panels.

7. The multi-panel display of claim 1, wherein display surfaces of the plurality of display panels are aligned substantially flush with another in a same display plane.

8. The multi-panel display of claim 1, wherein driving the display panels to display the images corresponding with the positions along the vibration axis includes counter-shifting majority portions of each of the images in a direction opposite a vibration direction of the given display panel to preserve spatial positions of image pixels for a majority of each of the images.

9. A method of disguising bezel seams between display panels, the method comprising:
   shifting pixel regions of the display panels to first positions, wherein while the pixel regions are at the first positions, first concealing portions of the pixel regions are positioned where at least portions of first sides of bezels of the display panels were previously positioned;
   displaying first component-images with the pixel regions of the display panels at the first positions;
   shifting the pixel regions to second positions, wherein while the pixel regions are at the second positions, second concealing portions of the pixel regions are positioned where at least portions of second sides of the bezels were previously positioned, the first sides and the second sides being on opposite sides of the bezels, and wherein a translation distance from the first positions to the second positions is twice a width of the first sides of the bezel; and
   displaying second component-images with the pixel regions of the display panels at the second positions, wherein the displays panels are shifted to the first and second positions at a vibration rate high enough to disguise the bezel seams between the display panels to a viewer.

10. The method of claim 9, wherein the first component-image and the second component-image of each display panel generates a compound-image, and wherein compound-images generated by the first component-images and the second-component images combine to form a perceived image that spans across the bezel seams between the display panels.

11. The method of claim 10, wherein the first concealing portions of the pixel regions display a first end section of the compound-image and the second concealing portions of the pixel regions display a second end section of a the compound-image that is opposite the first end section of the compound-image.

12. The method of claim 9, wherein the display panels are shifted in a first direction to reach the first position and shifted in a second direction to reach the second position, and wherein the first direction is toward first corners of the display panels and the second direction is toward second corners of the display panels, the first and second corners being opposite from each other for any given display panel.

13. The method of claim 9 further comprising:
shifting the pixel regions to third positions, wherein while the pixel regions are at the third positions, third concealing portions of the pixel regions are positioned where at least portions of third sides and the first sides of the bezels of the display panels were previously positioned;
displaying third component-images with the pixel regions of the display panels at the third positions;
shifting the display panels to fourth positions, wherein while the pixel regions are at the fourth positions, fourth concealing portions of the pixel regions are positioned where at least portions of fourth sides and the second sides of the bezels were previously positioned; and
displaying fourth component-images with pixel regions of the display panels at the fourth positions.

14. The method of claim 9, wherein the display panels are organic light emitting diode ("OLED") display panels, the method further comprising:
driving OLED pixels in the first concealing region to emit more image light per pixel than non-first concealing region OLED pixels of the pixel regions, when the display panels are at the first position; and
driving the OLED pixels in the second concealing region to emit more of the image light per pixel than non-second concealing region OLED pixels of the pixel regions, when the display panels are at the second position.

15. The method of claim 9, wherein the display panels are shifted to the first position and the second position asynchronously from each other.

16. A non-transitory machine-accessible storage medium that provides instructions that, when executed by a machine, will cause the machine to perform operations comprising:
shifting the display panels to first positions, wherein each of the display panels have pixel regions, and while the display panels are in the first positions, first concealing portions of the pixel regions are positioned, at least in part, where first sides of bezels of the display panels were previously positioned;
displaying first component-images with the pixel regions of the display panels at the first positions;
shifting the display panels to second positions, wherein while the display panels are in the second positions, second concealing portions of the pixel regions are positioned, at least in part, where second sides of the bezels were previously positioned, the first sides and the second sides being on opposite sides of the bezels, and wherein a translation distance from the first positions to the second positions is twice a width of the first sides of the bezel; and
displaying second component-images with the pixel regions of the display panels at the second positions, wherein the displays panels are shifted to the first and second positions at a vibration rate high enough to disguise the bezel seams between the display panels to a viewer.

17. The non-transitory machine-accessible storage medium of claim 16, wherein the first component-image and the second component-image of each display panel generates a compound-image, and wherein component-images generated by the first component-images and the second-component images combine to form a perceived image that spans across the bezel seams between the display panels.

18. The non-transitory machine-accessible storage medium of claim 16, wherein the first concealing portions of the pixel regions display a first end section of the compound-image and the second concealing portions of the pixel regions display a second end section of a the compound-image that is opposite the first end section of the compound-image.

19. The non-transitory machine-accessible storage medium of claim 16, further providing instructions that, when executed by the machine, will cause the machine to perform further operations, comprising:
shifting the display panels to third positions, wherein while the display panels are in the third positions, third concealing portions of the pixel regions are positioned where third sides and the first sides of the bezels were previously positioned;
displaying third component-images with the pixel regions of the display panels at the third positions;
moving the display panels to fourth positions, wherein while the display panels are in the fourth positions, fourth concealing portions of the pixel regions are positioned where fourth sides and the second sides of the bezels were previously positioned; and
displaying fourth component-images with the pixel regions of the display panels at the fourth positions.

20. The multi-panel display of claim 1, wherein the vibration mechanisms are configured to vibrate the plurality of display panels back and forth along the vibration axis a distance of twice the width of their bezels to disguise the seams.

* * * * *